(12) United States Patent
Bonilla et al.

(10) Patent No.: US 8,232,646 B2
(45) Date of Patent: Jul. 31, 2012

(54) INTERCONNECT STRUCTURE FOR INTEGRATED CIRCUITS HAVING ENHANCED ELECTROMIGRATION RESISTANCE

(75) Inventors: Griselda Bonilla, Hopewell Junction, NY (US); Kaushik Chanda, Hopewell Junction, NY (US); Ronald G. Filippi, Hopewell Junction, NY (US); Stephan Grunow, Hopewell Junction, NY (US); Chao-Kun Hu, Yorktown Heights, NY (US); Naftali E. Lustig, Hopewell Junction, NY (US); Andrew H. Simon, Hopewell Junction, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 12/691,213

(22) Filed: Jan. 21, 2010

(65) Prior Publication Data
US 2011/0175226 A1    Jul. 21, 2011

(51) Int. Cl.
*H01L 23/48* (2006.01)

(52) U.S. Cl. ......... 257/751; 257/E21.585; 257/E23.011; 438/637

(58) Field of Classification Search ............... 257/751, 257/726, E23.011; 438/627
See application file for complete search history.

(56) References Cited

U.S. PATENT DOCUMENTS

| | | | |
|---|---|---|---|
| 5,470,788 A | 11/1995 | Biery et al. | |
| 5,689,139 A | 11/1997 | Bui et al. | |
| 5,712,510 A | 1/1998 | Bui et al. | |
| 6,552,434 B2 | 4/2003 | Hasunuma et al. | |
| 6,992,002 B2 | 1/2006 | Dunham et al. | |
| 7,458,053 B2 | 11/2008 | Ruderer et al. | |
| 7,501,690 B2 | 3/2009 | Erturk et al. | |
| 8,089,160 B2 | 1/2012 | Wang et al. | |
| 2006/0160354 A1* | 7/2006 | Zhang et al. | 438/636 |
| 2007/0013072 A1 | 1/2007 | Ellis-Monaghan et al. | |
| 2008/0203589 A1 | 8/2008 | Bailey et al. | |
| 2009/0152724 A1 | 6/2009 | Wang et al. | |
| 2010/0159693 A1* | 6/2010 | Liu et al. | 438/637 |
| 2011/0254168 A1 | 10/2011 | Ding et al. | |

OTHER PUBLICATIONS

I.A. Blech, "Electromigration in thin aluminum films on titanium nitride", Journal of Applied Physics, Apr. 1976, pp. 1203-1208, vol. 47, No. 4, American Institute of Physics.
J. Lienig, "Interconnect and current density stress: an introduction to electromigration-aware design", SLIP' 05, 2005, pp. 81-88.
R. Otten et al., "Design Automation for Deepsubmicron: Present and Future", Proc. Conf. on Design, Automation and Test in Europe, 2002, pp. 650-657. IEEE.
Wang et al., "Electromigration threshold in copper interconnects", Applied Physics Letters, Jun. 2001, pp. 3598-3600, vol. 78 No. 23, American Institute of Physics.
C.-K. Hu et al; "Electromigration of Cu/low dielectric constant interconnects;" Microelectronics Reliabilty, Jul. 12, 2005.
C.-K. Hu et al.; "Electromigration reliability in nanoscale Cu interconnects;" MSR Fall 2007.

* cited by examiner

*Primary Examiner* — Victor A Mandala
*Assistant Examiner* — Krista Soderholm
(74) *Attorney, Agent, or Firm* — Cantor Colburn LLP; Wenji Li

(57) ABSTRACT

An interconnect structure for an integrated circuit (IC) device includes a metal line formed within a dielectric layer, the metal line having one or more vertical diffusion barriers therein; wherein the one or more vertical diffusion barriers correspond to a liner material of a via formed above the metal line, with the via extending completely through a thickness of the metal line such that a bottom most portion of the via comprises a portion of the metal line.

15 Claims, 6 Drawing Sheets

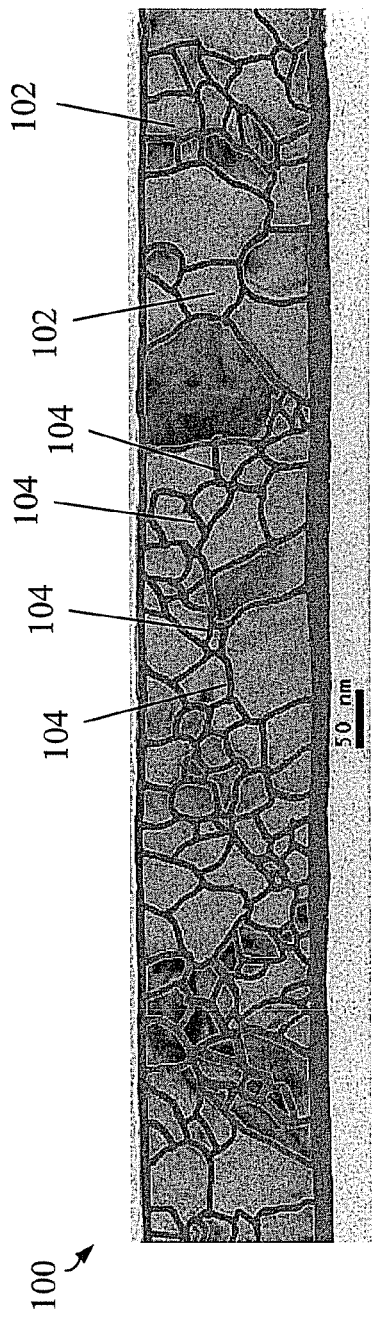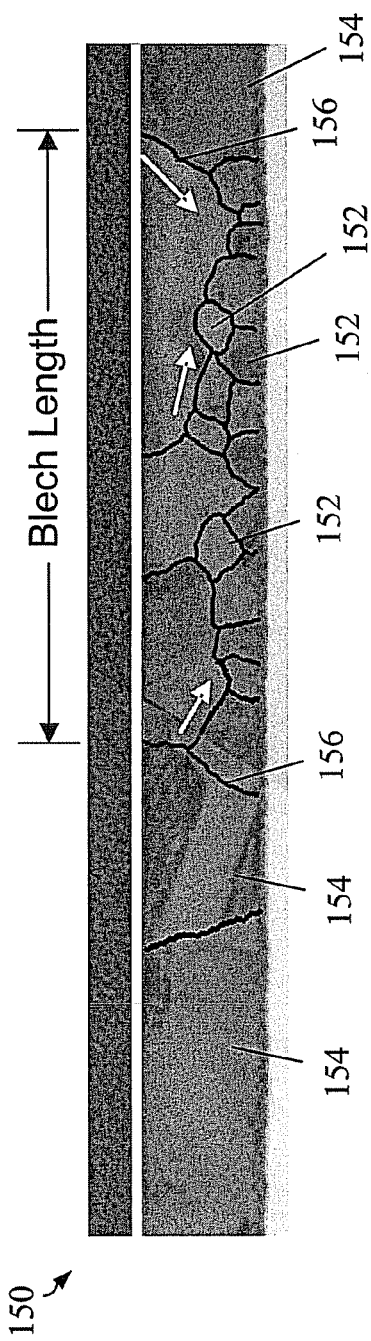
Figure 1(a)
Figure 1(b)

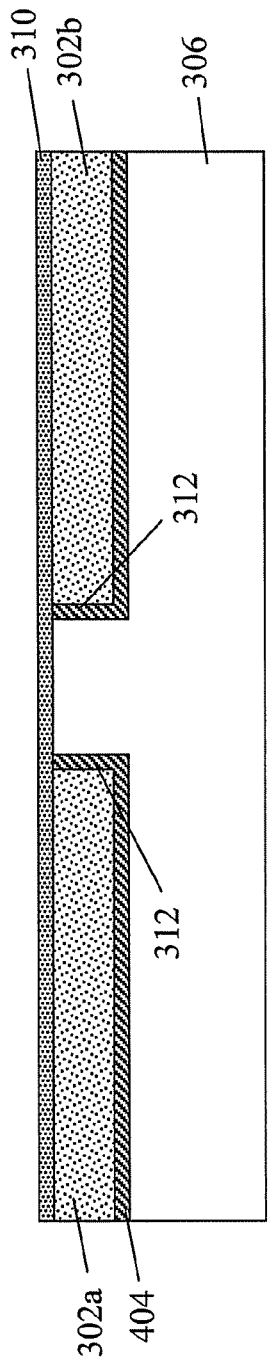
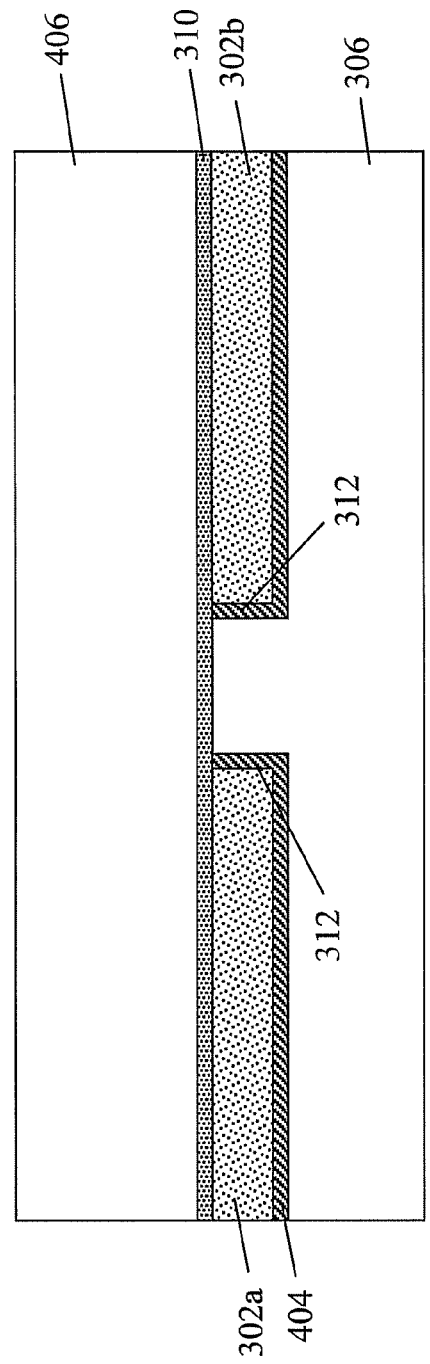
Figure 4(c)
Figure 4(d)

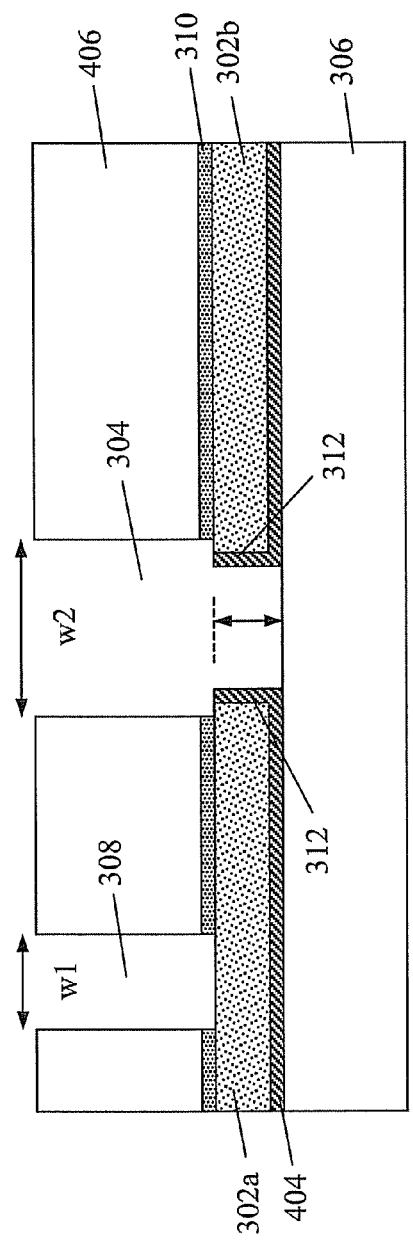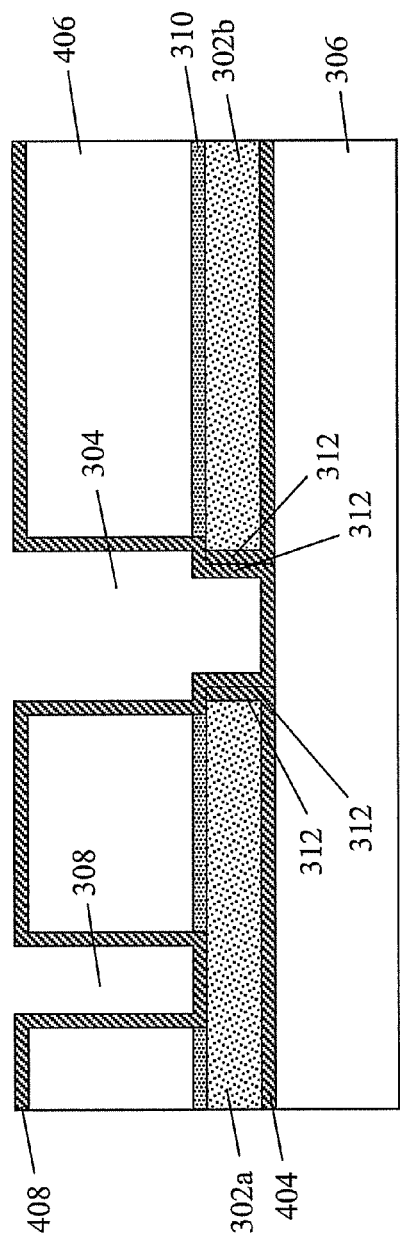
Figure 4(e)
Figure 4(f)

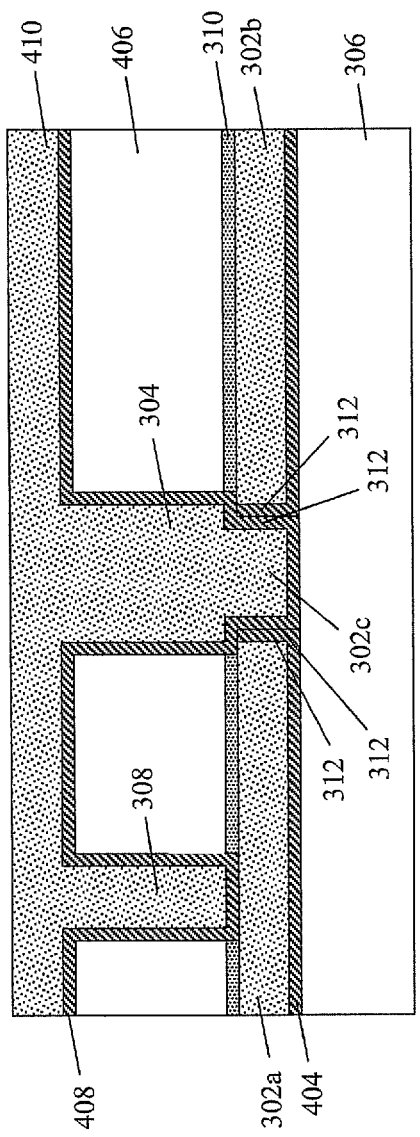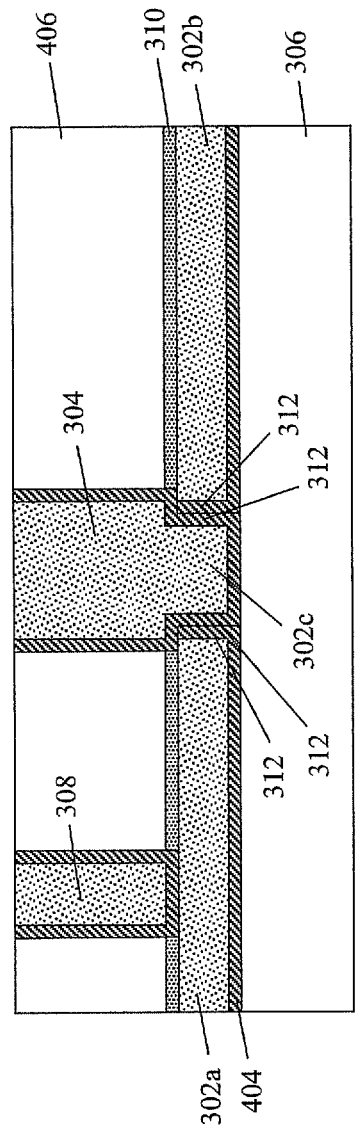

US 8,232,646 B2

INTERCONNECT STRUCTURE FOR INTEGRATED CIRCUITS HAVING ENHANCED ELECTROMIGRATION RESISTANCE

BACKGROUND

The present invention relates generally to integrated circuit (IC) device fabrication and, more particularly, to an interconnect structure for ICs having improved electromigration resistance characteristics.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of unidirectional or DC electrical current conduction therethrough. More specifically, the electron current collides with the diffusing metal atoms, thereby pushing them in the direction of current travel. Over an extended period of time, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design, as relative current densities through metallization lines continue to increase as the linewidth dimensions shrink.

SUMMARY

The foregoing discussed drawbacks and deficiencies of the prior art are overcome or alleviated, in an exemplary embodiment, by an interconnect structure for an integrated circuit (IC) device, including a metal line formed within a dielectric layer, the metal line having one or more vertical diffusion barriers therein; wherein the one or more vertical diffusion barriers correspond to a liner material of a via formed above the metal line, with the via extending completely through a thickness of the metal line such that a bottom most portion of the via comprises a portion of the metal line.

In another embodiment, an interconnect structure for an integrated circuit (IC) device includes a metal line formed within a dielectric layer, the metal line comprising a plurality of individual metal segments separated by vertical diffusion barriers; wherein the vertical diffusion barriers correspond to a liner material of one or more vias formed above the metal line segments, with each via extending completely through a thickness of the metal line such that a bottom most portion of the via comprises a portion of the metal line by electrically connecting adjacent metal line segments to one another.

In still another embodiment, a method of forming an interconnect structure for an integrated circuit (IC) device includes forming a plurality of individual metal line segments within a dielectric layer; and forming a via over the individual metal line segments, and filling the via with a liner material and a metal fill material such that the liner material on sidewalls of a bottom most portion of the via defines one or more vertical diffusion barriers and the metal fill material in the bottom most portion of the via electrically connects adjacent metal line segments to one another, and thereby defining a metal line.

BRIEF DESCRIPTION OF THE DRAWINGS

Referring to the exemplary drawings wherein like elements are numbered alike in the several Figures:

FIG. 1(a) is an image of a copper interconnect line on the order of about 150 nanometers in width, wherein the polycrystalline grain structure results in an increased probability of obtaining a continuous grain boundary pathway;

FIG. 1(b) is another image of a copper interconnect line having both regions of polycrystalline grain structure and regions of single crystal or bamboo grain structure;

FIGS. 4(a) through 4(h) are cross-sectional views illustrating an exemplary method of forming the structure of FIG. 3, in accordance with a further embodiment of the invention.

DETAILED DESCRIPTION

Figure 2:
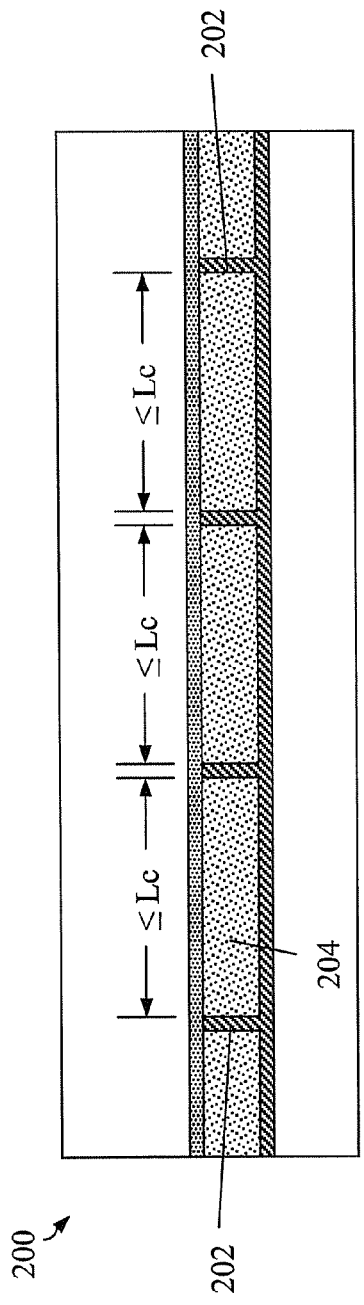
FIG. 2 is a cross-sectional view of an interconnect line having vertical electromigration diffusion barriers, wherein the vertical diffusion barriers comprise a similar liner material used for sidewall and bottom surfaces of the line, in accordance with an embodiment of the invention.

As indicated above, electromigration (EM) is a serious reliability concern for Dual Damascene copper (Cu) interconnects as the technology continues to scale from 45 nanometers (nm) to 32 nm to 22 nm. The reduced geometry of the Cu interconnects, due to traditional scaling, limits the allowable maximum current ($I_{dc}$) and restricts the current density through the wires, which seriously constrains circuit design. The electromigration lifetimes are determined by the Cu void growth rate, which in turn is influenced by the Cu interface and grain boundary diffusivities, the Cu microstructure and the divergence location of the mass flow. Of these terms, the Cu microstructure has typically been ignored due to the fact that the Cu microstructure, in sub micron features (e.g., >100 nm wide lines), is typically composed of single crystal grain segments. In other words, there exists a single grain per linewidth or per via.

However, as the dimensions of the electroplated Cu wires decrease even further (e.g., <100 nm wide lines), a mixture of single crystal grains and polycrystalline grains are observed. Moreover, the proportion of polycrystalline grains (i.e., 2 or more grains per linewidth) to single crystal grains increases significantly as the Cu line dimensions are reduced. For these cases, the contribution of mass transport by electromigration along the grain boundaries is no longer negligible because of the increased probability of obtaining a continuous grain boundary pathway. Additionally, the activation energy for transport along the grain boundaries is lower than that of the top surface (e.g., Cu/dielectric barrier) or that of the sidewall or bottom interface (e.g., Cu/Ta barrier). Therefore, diffusion along the grain boundaries will dominate the electromigration behavior for these small structures, leading to increased failure by electromigration.

As such, modifications directed toward improving the top surface or sidewall/bottom interfaces will not improve the lifetime behavior of these next generation IC devices. Although there is a considerable amount of ongoing work directed toward forming Cu single grain chains in narrow features, a limited understanding of the mechanisms for grain growth in such narrow features has contributed to a current lack of success in this endeavor.

Accordingly, disclosed herein is a structure and exemplary method of forming the same that takes advantage of the electromigration-induced backflow due to an electromigration-induced stress gradient known as the Blech effect. For sufficiently short lines or low current densities, the stress gradients can completely suppress mass transport. Traditionally, if all interconnects are designed to be shorter than a critical length, Lc, for a given current, j, then theoretically the given structure would be immune to electromigration effects.

Thus, interconnect structures may take advantage of the Blech effect by (1) interrupting the continuous grain boundary pathway with Cu single grain sections created every and/or less Lc distance apart, and by (2) placing vertical diffusion barriers (such as a liner material as described in more detail hereinafter) within a long Cu interconnect so that the distance between the vertical diffusion barriers is less than Lc. Both the Cu single grain sections and the vertical liners would effectively act as blocking boundaries that create a mechanical backflow which can cancel electromigration induced mass flow along the Cu grain boundary fast diffusion pathway and improve the lifetime of integrated circuit chips.

To illustrate this point in further detail, FIG. 1(a) is an image of a copper interconnect line 100 on the order of about 150 nm in width, wherein the polycrystalline grain structure 102 results in an increased probability of obtaining a continuous grain boundary pathway. In FIG. 1(a), it will be seen that multiple such grain boundary pathways 104 are present. Here, the fast diffusion path in interconnect line 100 is along the continuous grain boundary pathway 104. As such, any top Cu/dielectric barrier interface modifications will not significantly impact the lifetime behavior for this structure.

By way of comparison, FIG. 1(b) is another image of a copper interconnect line 150 having both regions 152 of polycrystalline grain structure and regions 154 of single crystal or bamboo grain structure. In this example the continuous fine grain sections 152 are of an overall length≦Lc, separated by Cu single grain sections 154 on either side of the fine grain sections 152. Accordingly, the vertically oriented grain boundaries 156 of the single grain sections 154 as diffusion blocking boundaries. Further, since the continuous grain boundary pathways of the fine grain sections 152 (e.g., such as shown along the white arrows) are limited to an overall length≦Lc, the mass transport of Cu atoms is suppressed.

For the case of Cu interconnects, the electromigration mass flow is in the direction of electron flow. During electromigration, the electron wind applies a force that results in an atomic flux, J, given by the following equation:

$$J = nv_e = n\left(\frac{D}{kT}\right)j\rho eZ^* \quad \text{(Eq. 1)}$$

where n is the density of atoms, $v_e$ is the drift velocity of migrating atoms, D is the effective diffusivity, k is Boltzmann's constant, T is the absolute temperature, j is the current density, $\rho$ is the resistivity and $eZ^*$ is the effective ion charge.

However, in the presence of a diffusion barrier, atoms accumulate at the anode end and deplete the cathode end of the conductor, leading to a stress gradient and back diffusion of atoms (see, for example, I. A. Blech, J. Appl. Phys. 47, 1203 (1976)). The combination of electromigration and the stress-induced back flow of atoms gives rise to a net atomic flux, $J_{eff}$, given by the following equation at steady state:

$$J_{eff} = n(v_e - v_b) = \frac{nD}{kT}\left(j\rho eZ^* - \frac{\Delta\sigma\Omega}{L}\right) \quad \text{(Eq. 2)}$$

where $v_b$ is the back flow velocity of atoms, $\Delta\sigma$ is the difference in stress between the cathode and the anode ends, $\Omega$ is the atomic volume and L is the conductor length. A linear stress gradient develops after a certain period of time under steady state conditions when a diffusion blocking material is located at both ends of the line.

When the back stress gradient balances the electromigration force, mass transport is completely suppressed. This phenomenon is referred to as the electromigration threshold or the short-length effect, and occurs for sufficiently short interconnects and low current densities. The threshold condition is defined from the above relation for $J_{eff}$ such that:

$$(jL)_{th} = \frac{\Delta\sigma\Omega}{\rho eZ^*} \quad \text{(Eq. 3)}$$

where $(jL)_{th}$ is referred to as the threshold length product. For jL values less than $(jL)_{th}$, there is no electromigration failure in the interconnect structure. If j and L correspond exactly to the threshold condition, then the length of the interconnect corresponds to what is referred to as the critical length. The short-length effect has been observed not only in AlCu interconnects with W interlevel studs, but in Dual Damascene Cu interconnects with interlevel vias, wherein the Dual Damascene interconnects utilize liner materials such as tantalum (Ta), tantalum nitride (TaN), titanium (Ti), titanium nitride (TiN), tungsten (W), tungsten nitride (WN), ruthenium (Ru), ruthenium nitride (RuN), manganese (Mn), and cobalt (Co) for example as diffusion barriers.

While a structure such as that shown in FIG. 1(b) would effectively make use of the Blech effect, it is difficult to produce the single grain sections at appropriate intervals as linewidths continue to scale as mentioned above. Accordingly, FIG. 2 is a cross-sectional view of an interconnect structure 200 having vertical electromigration diffusion barriers 202, wherein the vertical diffusion barriers comprise a similar liner material used for sidewall and bottom surfaces of the line, in accordance with an embodiment of the invention. As is shown, each Cu section 204 of the interconnect structure 200 has a length≦Lc, separated by the vertical diffusion barriers 202 on either side of the Cu section 204 that act as diffusion blocking boundaries.

Figure 3:
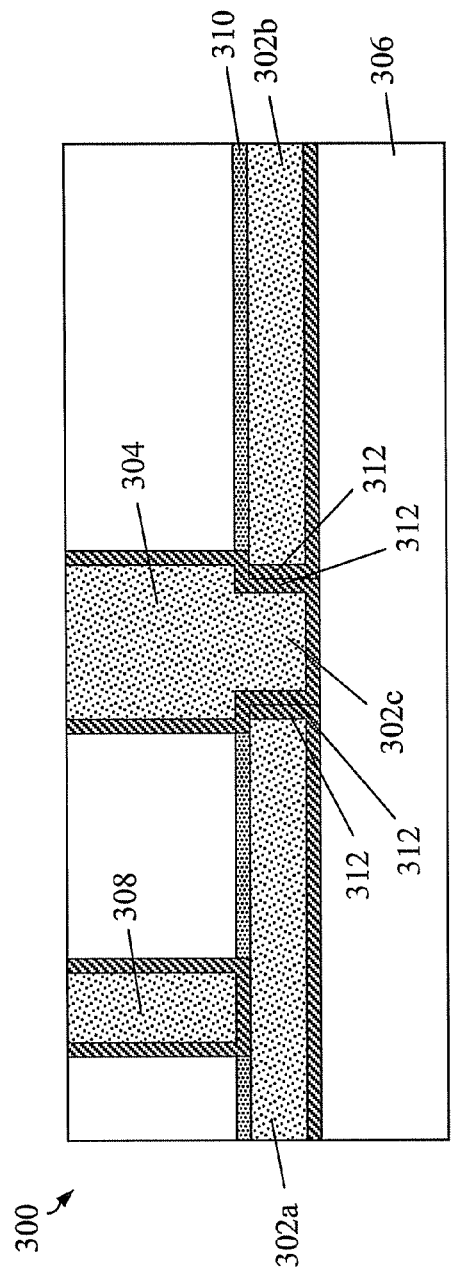
FIG. 3 is a cross-sectional view of an interconnect line illustrating one specific embodiment of a vertical diffusion barrier as generally illustrated in FIG. 2.

In further detail, FIG. 3 is a cross-sectional view of an interconnect structure 300 illustrating one specific embodiment of a vertical diffusion barrier as generally illustrated in FIG. 2. As will be noted, a first section 302a of a Cu line is separated from a second section 302b of the Cu line by a third section 302c. More specifically, the third section 302c is the bottom most portion of a vertical via 304 that (as opposed to conventional vias that terminate on the top surface of the line) actually extends completely through the thickness of the line, down to the top of the interlevel dielectric (ILD) layer 306 in which the line is formed. By way of comparison, a more conventional via 308 is also shown formed over the first section 302a of the line, wherein the via 308 is etched through a cap layer 310 formed atop the Cu line.

More significantly, it will be noted from FIG. 3 that the Cu sections 302a, 302b, 302c are separated from one another by vertical liner portions 312. In the embodiment depicted, the vertical liner portions 312 are formed both prior to depositing the copper line sections 302a, 302b, and prior to filling the via 304 including section 302c. The vertical liner portions 312 may be of the same or a different liner material that that used in conjunction with the bottom and sidewalls of the Cu sections 302a, 302b. Thus configured, a plurality of such vias 304 spaced at intervals corresponding the Blech critical length or shorter will ensure electromigration resistance due to the presence of the vertical liners 302, acting as EM diffusion barriers.

Referring now to FIGS. 4(a) through 4(h), a series of cross-sectional views is shown, illustrating an exemplary method of forming the structure of FIG. 3 in accordance with a further embodiment of the invention. In the example illustrated, the Cu lines are formed at a first level (M1) of metallization, although it will be appreciated that such techniques are equally applicable to other metal levels within an integrated circuit device. For purposes of simplicity, front end of line (FEOL) structures are not illustrated in the figures, such as a semiconductor substrate beneath the ILD layer 306, any transistor devices formed therein, or contact area (CA) vias that connect such transistor devices to the first level (M1) of metal.

Figure 4A:
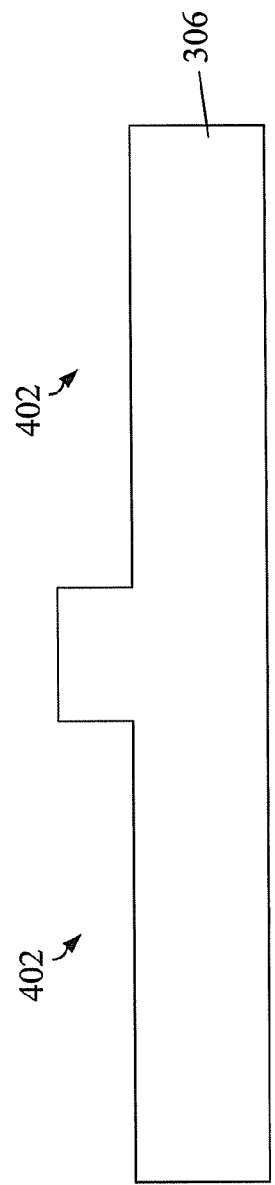
Figure 4B:
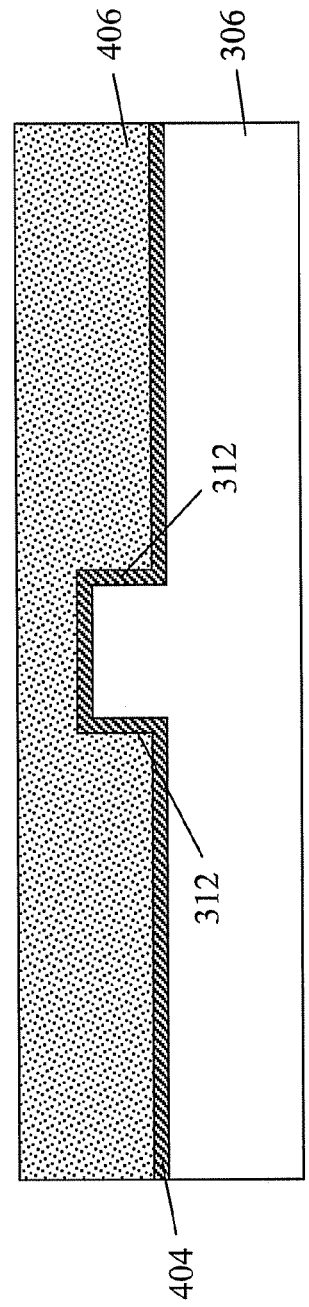

Beginning in FIG. 4(a), a pair of individual trenches 402 is patterned within ILD layer 306, instead of a single long trench. It will be understood that for longer lengths of line, there may be multiple such individual trenches 402, each corresponding to the Blech length. Then, as shown in FIG. 4(b), a liner material (e.g., Ta/TaN, Ru, Mn, Co, etc.) 404 is formed over the ILD layer 306, thereby resulting in vertical portions 312 as discussed above. The liner material deposition 404 is followed by a blanket formation of the line metal 406 (e.g., Cu) such as by chemical vapor deposition (CVD), physical vapor deposition (PVD), electroplating or combinations thereof.

Following chemical mechanical polishing (CMP) to planarize the line metal 406 and liner material 404 down to the top most portion of the ILD between trenches, a cap layer 310 (e.g., a dielectric such as SiN, or a conductive material such as CoWP) as discussed above is formed over the copper line sections 302a, 302b and the ILD layer 306, as shown in FIG. 4(c). Next, as shown in FIG. 4(d), another ILD layer 406 is formed over the cap layer 310. Ordinarily, the M1 wiring would be completed at this point; however, as shown in FIG. 4(e), the via patterning and etching within ILD layer 406 is also used to remove the remaining portion of dielectric material between the first and second copper line sections 302a, 302b. As the etch rate of the ILD material is dependent upon the aspect ratio of the vias, the width w2 of the via 304 is made somewhat larger than the width w1 of the conventional via so as to allow for the over etch of ILD material from the dashed line in FIG. 4(e) down to the bottom level of the Cu lines in the M1 wiring.

Referring now to FIG. 4(f), another deposition of liner material 408 is illustrated, which results in the definition of additional vertical diffusion barrier portions 312 between the first and second copper line sections 302a, 302b. This is followed by copper via metallization 410 as shown in FIG. 4(g). Although not specifically illustrated, it is contemplated that this step could be performed as a dual damascene operation where the definition of the next level (e.g., M2) trenches is also performed prior to liner and metal deposition. In any case, filling of the deep via 304 results in the formation of the third section 302c of the M1 line. Finally, the excess metal 410 and top portions of liner material 408 in FIG. 4(g) are planarized, resulting in the EM resistant structure shown in FIG. 4(h).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An interconnect structure for an integrated circuit (IC) device, the structure comprising:
   a metal line formed within a dielectric layer, the metal line having one or more vertical diffusion barriers therein;
   wherein the one or more vertical diffusion barriers correspond to a liner material of a via formed above the metal line, with the via extending completely through a thickness of the metal line such that a bottom most portion of the via comprises a portion of the metal line.

2. The structure of claim 1, wherein adjacent vertical diffusion barriers are spaced apart by a distance less than or equal to a Blech length of the metal line.

3. The structure of claim 2, wherein the metal line comprises copper.

4. The structure of claim 1, wherein the liner material of the via corresponding to the one or more vertical diffusion barriers comprises a same material as a liner material for bottom and sidewall surfaces of the metal line.

5. The structure of claim 4, wherein the vertical diffusion barriers comprise one of tantalum, tantalum nitride, titanium, titanium nitride, tungsten, tungsten nitride, ruthenium, ruthenium nitride, manganese, cobalt and combinations thereof.

6. An interconnect structure for an integrated circuit (IC) device, the structure comprising:
   a metal line formed within a dielectric layer, the metal line comprising a plurality of individual metal segments separated by vertical diffusion barriers;
   wherein the vertical diffusion barriers correspond to a liner material of one or more vias formed above the metal line segments, with each via extending completely through a thickness of the metal line such that a bottom most portion of the via comprises a portion of the metal line by electrically connecting adjacent metal line segments to one another.

7. The structure of claim 6, wherein the individual metal segments between vertical diffusion barriers have a length less than or equal to a Blech length of the metal line.

8. The structure of claim 7, wherein the metal line segments and the bottom most portions of the one or more vias comprise copper.

9. The structure of claim 6, wherein the liner material of the via corresponding to the one or more vertical diffusion barriers comprises a same material as a liner material for bottom and sidewall surfaces of the metal line.

10. The structure of claim 9, wherein the vertical diffusion barriers comprise one of tantalum, tantalum nitride, titanium, titanium nitride, tungsten, tungsten nitride, ruthenium, ruthenium nitride, manganese, cobalt and combinations thereof.

11. A method of forming an interconnect structure for an integrated circuit (IC) device, the method comprising:

forming a plurality of individual metal line segments within a dielectric layer; and forming a via over the individual metal line segments, and filling the via with a liner material and a metal fill material such that the liner material on sidewalls of a bottom most portion of the via defines one or more vertical diffusion barriers and the metal fill material in the bottom most portion of the via electrically connects adjacent metal line segments to one another, and thereby defining a metal line.

12. The method of claim 11, wherein the individual metal line segments between vertical diffusion barriers have a length less than or equal to a Blech length of the metal line.

13. The method of claim 12, wherein the metal line segments and the bottom most portions of the one or more vias comprise copper.

14. The method of claim 11, wherein the liner material of the via corresponding to the one or more vertical diffusion barriers comprises a same material as a liner material for bottom and sidewall surfaces of the metal line segments.

15. The method of claim 14, wherein the vertical diffusion barriers comprise one of tantalum, tantalum nitride, titanium, titanium nitride, tungsten, tungsten nitride, ruthenium, ruthenium nitride, manganese, cobalt and combinations thereof.

* * * * *